(12) United States Patent
Tanaka

(10) Patent No.: US 7,211,938 B2
(45) Date of Patent: May 1, 2007

(54) DOUBLE-SIDED DISPLAY DEVICE AND METHOD OF FABRICATING THE SAME

(75) Inventor: Shinsuke Tanaka, Yamagata-ken (JP)

(73) Assignee: Tohoku Pioneer Corporation, Yamagata (JP)

( * ) Notice: Subject to any disclaimer, the term of this patent is extended or adjusted under 35 U.S.C. 154(b) by 258 days.

(21) Appl. No.: 11/074,657

(22) Filed: Mar. 9, 2005

(65) Prior Publication Data

US 2005/0200798 A1    Sep. 15, 2005

(30) Foreign Application Priority Data

Mar. 10, 2004   (JP)   ............................. 2004-067169

(51) Int. Cl.
*H01J 61/94*   (2006.01)

(52) U.S. Cl. ..................... 313/1; 313/495; 313/496; 313/497; 313/309; 313/310; 313/311

(58) Field of Classification Search ......... 313/498–512
See application file for complete search history.

(56) References Cited

FOREIGN PATENT DOCUMENTS

| JP | 08-153586 | 6/1996 |
|---|---|---|
| JP | 2004-014316 | 1/2004 |

*Primary Examiner*—David Bruce
*Assistant Examiner*—Rachelle Harding
(74) *Attorney, Agent, or Firm*—Arent Fox LLP

(57) ABSTRACT

A double-sided display device includes a pair of substrates, on which self-emitting elements are formed respectively, being bonded to each other. A lead wiring section of the self-emitting element area formed on one of the substrates and a lead wiring section of the self-emitting element area formed on the other substrate are formed on the same side of the substrates. Each of the lead wiring sections is formed in a part of the side of each of the substrates. In addition, cutout portions are formed in parts of the sides of the substrates where the lead wiring sections are not formed. Thus, in the double-sided display device, the lead wiring sections formed on ends of substrates can be easily connected with a driving circuit component, a wiring substrate or the like, while the space for the double-sided display device can be reduced.

6 Claims, 6 Drawing Sheets

DOUBLE-SIDED DISPLAY DEVICE AND METHOD OF FABRICATING THE SAME

BACKGROUND OF THE INVENTION

The present invention relates to a double-sided display device and a method of fabricating the same.

The present application claims priority from Japanese Patent Application No. 2004-067169, the disclosure of which is incorporated herein by reference.

Various types of self-emitting flat panel display devices such as an organic electroluminescence (EL) display device, a plasma display panel (PDP), and a field emission display (FED) have recently been developed. In these display devices, a display is formed by arranging self-emitting elements on a substrate. Therefore, the display devices have attracted attention as display devices which are advantageous over liquid crystal displays requiring a backlight in possibility of reduction of power consumption as well as of thickness.

Moreover, in the self-emitting flat panel display devices, substrates of two displays are bonded to each other so that their light-emitting sides are oriented outward. As a result, a double-sided display device enabling the display on both sides can be formed. In Japanese Patent Application Laid-Open Nos. Hei 8-153586 and 2004-14316, a double-sided display device formed by an organic EL display device is disclosed. In the case of the organic EL display device, a sealing structure for blocking organic EL elements formed on a substrate from the outside air is required because the organic EL elements have a property of deteriorating its display performance when they are exposed to the outside air containing moisture and the like. According to the above-described conventional techniques, substrates, each being a transparent substrate on which an organic EL element is formed, are bonded to each other so that their faces carrying the organic EL elements face each other. In this manner, the organic EL elements are sealed between the pair of substrates. A display plane is formed on the bottom face side of each of the substrates so that the display planes of the respective substrates are oriented in the opposite directions, thereby achieving the display on both sides.

In a self-emitting display device such as the above-described organic EL display device, the following structure is used. A lead wiring section is formed on an end of a substrate by a lead wiring led from a self-emitting element area in a sealing structure so as to connect a driving circuit component or a wiring substrate for supplying a driving signal to the self-emitting element area. With such a structure, the lead wiring section and a connecting section such as the driving circuit component or the wiring substrate are electrically connected with each other.

On the other hand, as the above-described conventional technique, if a pair of substrates, on which self-emitting element areas are respectively formed, are bonded to each other so that their faces carrying the self-emitting element areas face each other, lead wiring sections, each formed in an end of each of the substrates, are arranged so as to be opposed to each other. Accordingly, there arises a problem that, when one of the lead wiring sections is connected to the driving circuit component, the wiring substrate, or the like, the other lead wiring section interferes in connection, making the connecting operation difficult.

In order to avoid such interference, the substrates are bonded to each other so that their lead wiring sections are oriented in different directions; the lead wiring section of one of the substrates does not overlap the lead wiring section of the other substrate. With such a structure, however, the lead wiring sections project in different directions. Therefore, the entire panel area is increased to correspondingly increase the space occupied by the display device when the display device is placed. Accordingly, there arises a problem that such a display device does not satisfy the requirement of reduction in size, which is requested for mounting it on small electronic equipment.

Moreover, with the structure in which the lead wiring sections on a pair of substrates project in different directions, a plurality of driving circuit components, wiring substrates or the like, connected to the lead wiring sections are correspondingly required, or a large wiring substrate for covering the different directions of projections is required. Therefore, an excessively large space in electronic equipment is occupied by the plurality of driving circuit components, wiring substrates or the like. Also in this regard, there arises the problem that the requirement of reduction in size is not satisfied.

SUMMARY OF THE INVENTION

The present invention has an object of coping with the above-described problems. Specifically, in a double-sided display device including: a pair of substrates, each including a self-emitting element area formed thereon, the substrates being bonded to each other so that their faces carrying the self-emitting element areas face each other; and display planes, each being formed on the side of a bottom face of each of the substrates, the display planes being formed so as to be oriented in opposite directions, the present invention has objects of allowing easy connection of lead wiring sections formed on the respective ends of the substrates with a driving circuit component, a wiring substrate, or the like, and enabling the reduction in space where a panel of the double-sided display device is placed or where the entire module including the driving circuit component, the wiring substrate, or the like is placed.

In order to achieve the above object, a double-sided display device and a method of fabricating the same according to the present invention include at least a configuration according to each of the following independent aspects of the invention.

In a first aspect of the present invention, a double-sided display device comprises: a pair of substrates each including a self-emitting element area formed thereon, the substrate being bonded to each other so that their faces carrying the self-emitting element areas face each other; and displays each being formed on the side of a bottom face of each of the substrates, the displays being formed so as to be oriented in opposite directions, wherein: a lead wiring section of the self-emitting element area formed on one of the substrates and a lead wiring section of the self-emitting element area formed on the other substrate are formed on the respective ends of the substrates on the same side; each of the lead wiring sections is formed on a part of the end of each of the substrates; and a cutout portion is formed in a part of the end of each of the substrates where the lead wiring section is not formed.

In a second aspect of the present invention, a method of fabricating a double-sided display device (the display device including: a pair of substrates each including a self-emitting element area formed thereon, the substrates being bonded to each other so that their faces carrying the self-emitting element areas face each other; and displays each being formed on the side of a bottom face of each of the substrates, the displays being formed so as to be oriented in opposite directions) comprises the steps of: forming the self-emitting element areas on the substrates, respectively, and forming lead wiring sections of the self-emitting element areas on parts of ends of the respective substrates, respectively; bonding the substrates to each other so that the lead wiring sections are positioned on the same side; and forming a cutout portion in a part of the end of each of the substrates where the lead wiring section is not formed.

BRIEF DESCRIPTION OF THE DRAWINGS

These and other objects and advantages of the present invention will become clear from the following description with reference to the accompanying drawings, wherein:

FIG. 1A is a sectional view taken along the line I—I in FIG. 1B, FIG. 1B is a plan view showing the double-sided display device, and FIG. 1C is a plan view when viewed from the side of one of substrates, on which a self-emitting element area is formed;

FIG. 4A is a sectional view taken along the line II—II in FIG. 4B, and FIG. 4B is a plan view;

DETAILED DESCRIPTION OF THE PREFERRED EMBODIMENTS

Figure 1A:
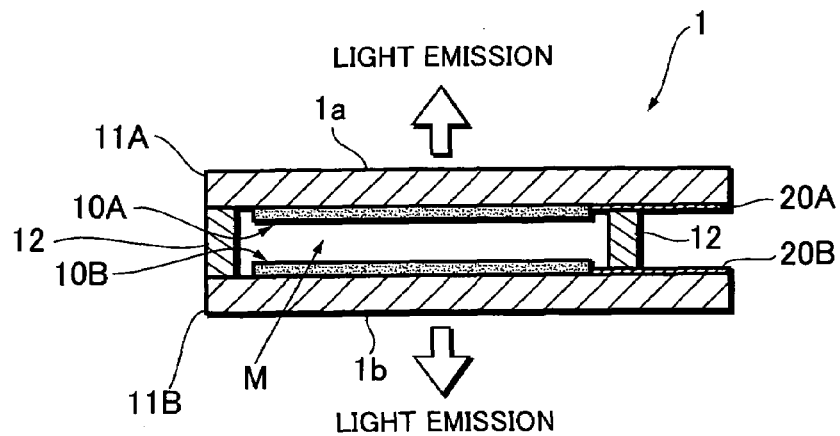
FIGS. 1A to 1C are explanatory views for showing a structure of a double-sided display device according to an embodiment of the present invention, where
Figure 1B:
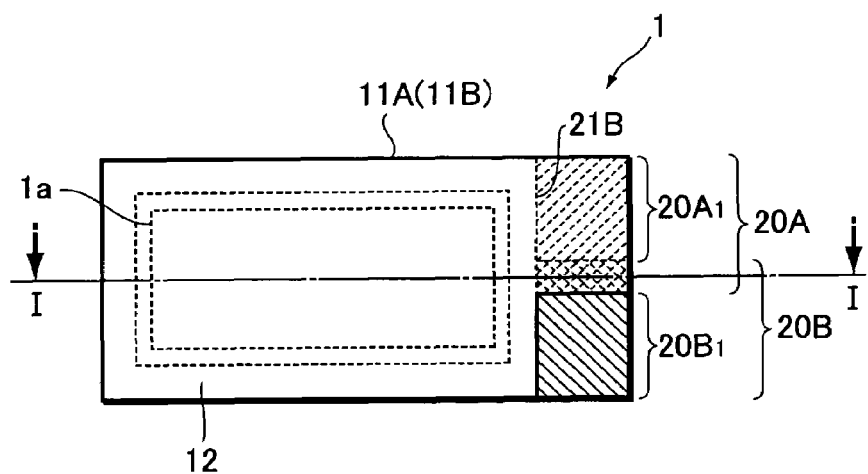
Figure 1C:
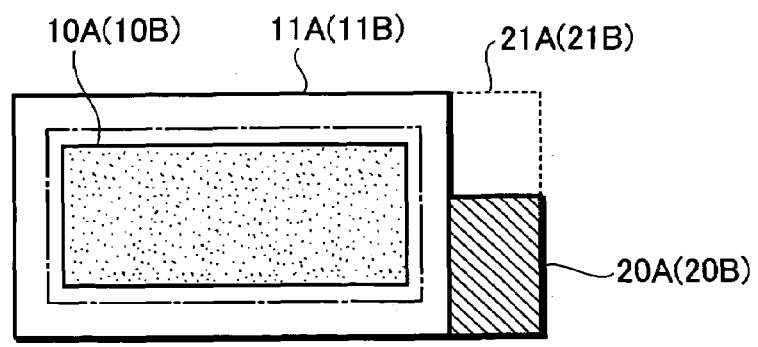

Hereinafter, an embodiment of the present invention will be described with reference to the accompanying drawings. FIGS. 1A to 1C are explanatory views showing a structure of a double-sided display device according to an embodiment of the present invention FIG. 1A is a sectional view taken along the line I—I in FIG. 1B, FIG. 1B is a plan view showing the double-sided display device, and FIG. 1C is a plan view when viewed from the side of one of substrates, on which a self-emitting element area is formed. A double-sided display device 1 has the following configuration. A pair of substrates 11A and 11B, on which self-emitting element areas 10A and 10B are respectively formed, are bonded to each other so that their faces carrying the self-emitting element areas 10A and 10B face each other. Display planes 1a and 1b are formed on the bottom face sides of the substrates 11A and 11B, respectively, so as to be oriented in opposite directions.

Each of the self-emitting element areas 10A and 10B may be formed by a self-emitting element alone or the arrangement of a plurality of self-emitting elements. Each of the substrates 11A and 11B is formed of a transparent or semi-transparent substrate. Light emitted from the self-emitting element areas 10A and 10B can be obtained through the substrates 11A and 11B, thereby forming the display planes 1a and 1b on the respective bottom sides. In the illustrated example, a bonding layer 12 is interposed between the substrates 11A and 11B. A sealed space M surrounded by the substrates 11A and 11B and bonding layers 12 is formed. In the sealed space M, the self-emitting element areas 10A and 10B are formed.

In the double-sided display device 1, a lead wiring is led from each of the self-emitting element areas 10A and 10B formed in the sealed space M to the outside of the sealed space M. A lead wiring section 20A formed by putting lead wirings together is formed on an end of the substrate 11A, whereas a lead wiring section 20B is formed on an end of the substrate 11B in the same manner. The lead wiring section 20A of the self-emitting element area 10A formed on the substrate 11A and the lead wiring section 20B of the self-emitting element area 10B formed on the other substrate 11B are formed on the same side for both the substrates 11A and 11B.

Furthermore, the lead wiring section 20A is formed on a part of one end of the substrate 11A, whereas the lead wiring section 20B is formed on a part of one end of the substrate 11B. In addition, a cutout portion 21A is formed in the end of the substrate 11A where the lead wiring section 20A is not formed, whereas a cutout portion 21B is formed in the end of the substrate 11B where the lead wiring section 20B is not formed (see FIG. 1C). The cutout portions 21A and 21B are formed by partially cutting the ends of the rectangular substrates 11A and 11B where the lead wiring sections 20A and 20B are formed so as to be on the outer side of the bonding layer 12. In this embodiment, the cutout portions 21A and 21B are provided so that parts $20A_1$ and $20B_1$, which do not overlap the lead wiring sections 20A and 20B, are formed at least partially when the substrates 11A and 11B are bonded to each other.

According to the double-sided display device in the embodiment of the present invention as described above, the display planes 1a and 1b are formed on the respective bottom face sides of the substrates 11A and 11B so as to be opposed to each other. As a result, double-sided display for emitting light from both sides can be realized. Moreover, since the substrates 11A and 11B are bonded to each other so that the lead wiring sections 20A and 20B of the self-emitting element areas 10A and 10B formed on the substrates 11A and 11B are positioned on the same side of the substrates 11A and 11B, the area occupied by the entire device can be reduced as compared with the case where the substrates are bonded to each other so that lead wiring sections 20A and 20B are oriented in different directions. Furthermore, since the lead wiring sections 20A and 20B are formed so as to be oriented in the same direction, a structure, in which a single driving circuit component or wiring substrate is connected to both the lead wiring sections 20A and 20B, can be achieved.

Furthermore, each of the lead wiring sections 20A and 20B is formed in a part of one side of each of the substrates 11A and 11B. At the same time, the cutout portions 21A and 21B are formed in a part of the side of the substrates where the lead wiring sections 20A and 20B are not formed. Accordingly, the parts $20A_1$ and $20B_1$, which do not overlap the lead wiring sections 20A and 20B when the substrates 11A and 11B are bonded to each other, can be formed. As a result, the operation for connecting a driving circuit component or a wiring substrate to the lead wiring sections 20A and 20B can be facilitated. In the embodiment shown in FIGS. 1A to 1C, the example where the cutout portions 21A and 21B are formed in both the substrates 1A and 11B is given. However, the practical effects can be obtained to a certain degree if only one cutout portion is formed in either one of the substrates.

Figure 2:
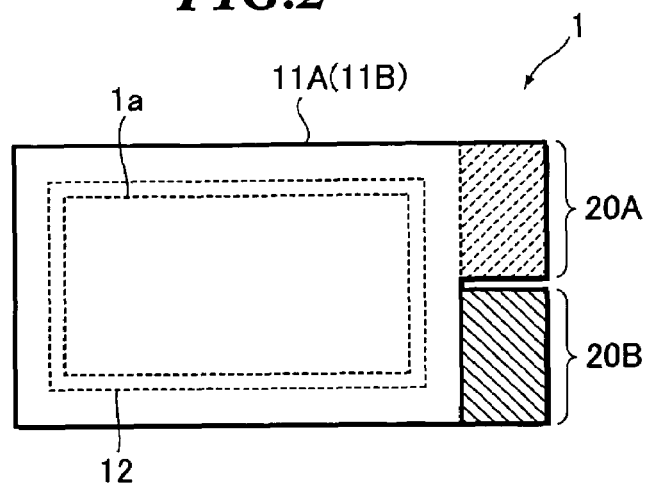
FIG. 2 is an explanatory view (plan view) showing a variation of the double-sided display device according to the embodiment of the present invention.
Figure 3:
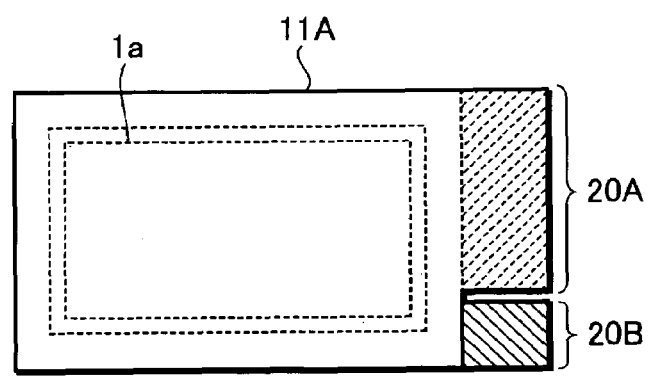
FIGS. 3A and 3B are explanatory views (a plan view and a rear view) showing another variation of the double-sided display device according to the embodiment of the present invention.
Figure 3:
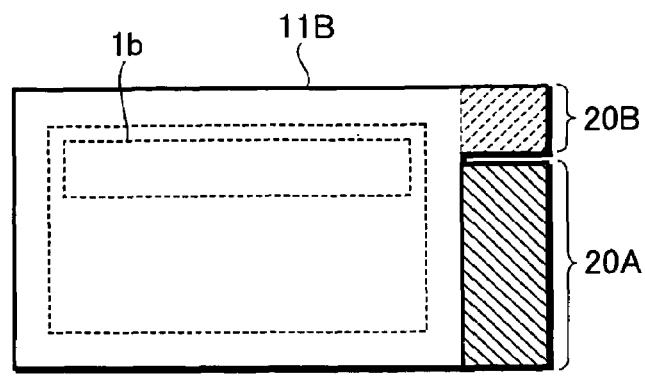

FIGS. 2, 3A, and 3B show variations of the above-described embodiments. FIG. 2 shows a variation where the lead wiring sections 20A and 20B are formed so as not to overlap each other. According to this structure, the operation of connecting a driving circuit component or a wiring substrate to the lead wiring sections 20A and 20B can be further facilitated in addition to the advantage of the above-described embodiment.

FIGS. 3A and 3B (FIG. 3A is a plan view viewed from the substrate 11A side, and FIG. 3B is a rear view viewed form the substrate 11B side) show a variation where the widths occupied by the lead wiring sections 20A and 20B are formed to differ from each other on one side of the substrates 11A and 11B. This structure is advantageous, for example, in the case where the display 1a on the side of the substrate 11A is used as a main screen, whereas the display 1b on the side of the substrate 11B side is used as a sub-screen having a smaller area than that of the main screen. The width of the lead wiring section 20B on the side of the sub-screen is set smaller than that of the lead wiring section 20A on the side of the main screen. As a result, the wiring density can be kept uniform.

Figure 4:
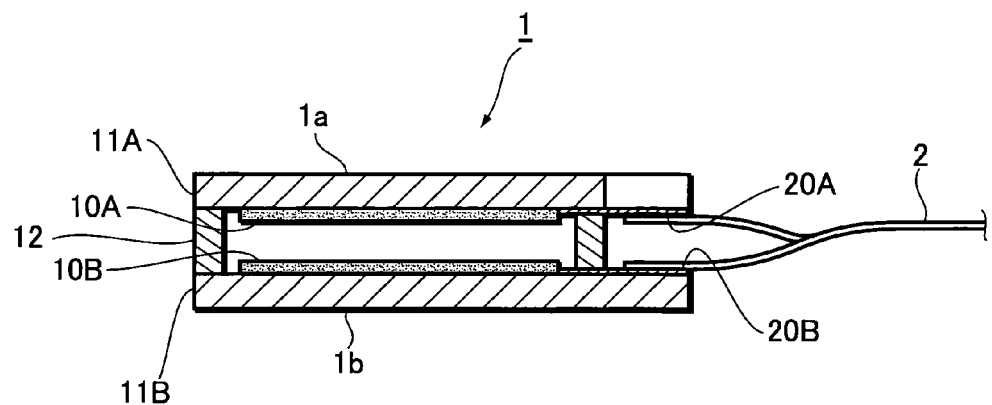
FIGS. 4A and 4B are explanatory views showing a state where a wiring substrate (flexible wiring substrate) is connected to the double-sided display device according to the embodiment of the present invention, where
Figure 4:
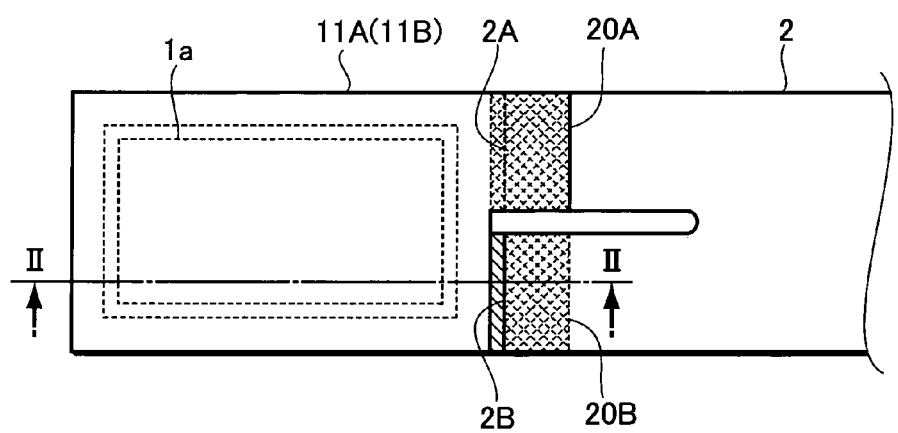

FIGS. 4A and 4B are explanatory views showing a state where a wiring substrate (flexible wiring substrate) 2 is connected to the double-sided display device 1 according to the above-described embodiment of the present invention (FIG. 4A is a sectional view taken along the line II—II in FIG. 4B and FIG. 4B is a plan view). In this example, connecting ends 2A and 2B branching from the single wiring substrate 2 are connected to the respective lead wiring sections 20A and 20B. The wiring substrate 2 has two branching ends. A terminal portion of the connecting end 2A for connection to the lead wiring section 20A is formed for one branching end of the wiring substrate 2 on the side of one face, whereas a terminal portion of the connecting end 2B for connection to the lead wiring section 20B is formed for the other branching end of the wiring substrate 2 on the other face side. Specifically, the terminal portions of the wiring substrate 2 are formed on the branching connecting ends 2A and 2B so as to be on the surfaces different with each other.

According to this embodiment, for transmitting signals for displaying images respectively on the two display planes 1a and 1b of the double-sided display device 1, driving signals can be transmitted to the self-emitting element areas 10A and 10B through the lead wiring sections 20A and 20B by using the single wiring substrate 2. In this manner, the connection with a driving circuit can be achieved by the single wiring substrate 2 even for double-sided display which substantially requires two driving paths. Therefore, the space for the entire unit including the wiring substrate 2 can be reduced.

Figure 5:
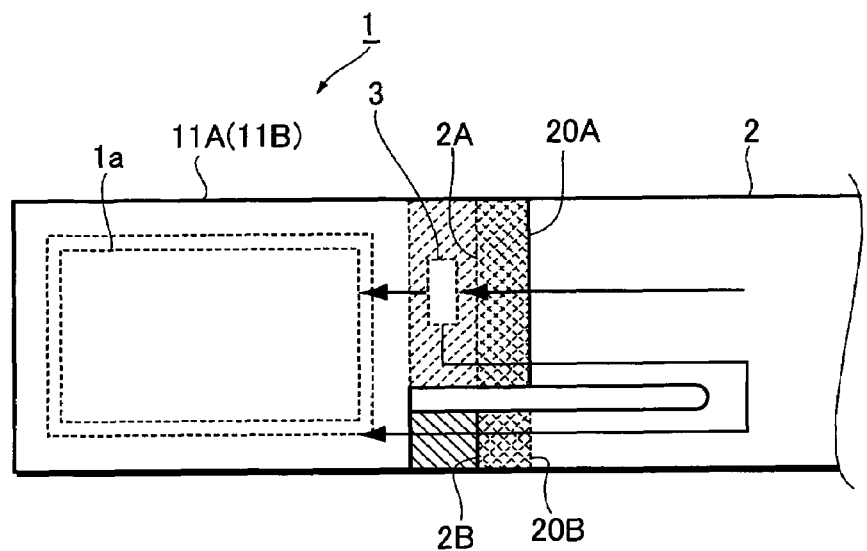
FIG. 5 is an explanatory view showing an example of mounting a driving circuit element on the double-sided display device according to the embodiment of the present invention.
Figure 6:
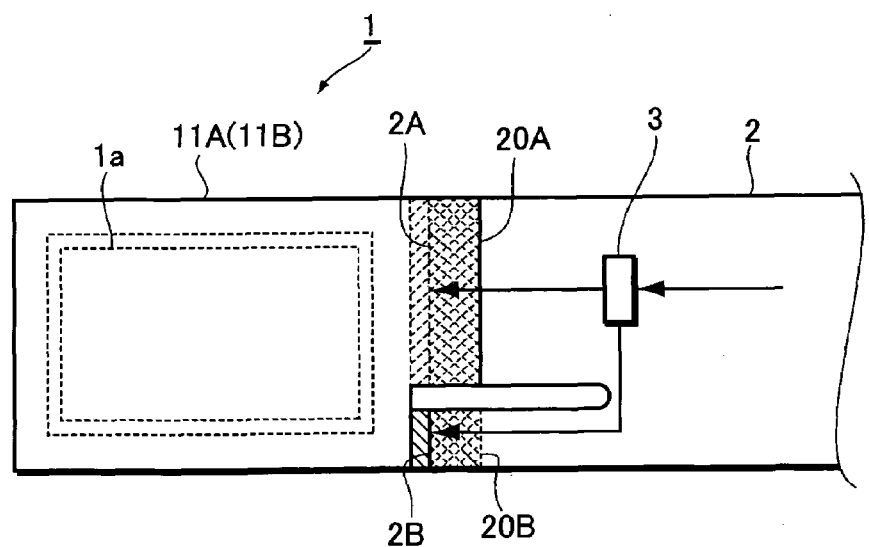
FIG. 6 is an explanatory view showing another example of mounting a driving circuit element on the double-sided display device according to the embodiment of the present invention.

FIGS. 5 and 6 are explanatory views, each showing an example of mounting a driving circuit element on the double-sided display device 1 according to the above-described embodiment. FIG. 5 shows an example of a COG (Chip On Glass), in which a driving circuit element (semiconductor chip) 3 is mounted on the lead wiring section 20A (or 20B) of the substrate 11A (or 11B). In such a mounting mode of the driving circuit element 3, only the self-emitting element area 10A on one side can be driven by the driving circuit element 3. Alternatively, signal input paths as indicated with arrows can also be formed so that the self-emitting element areas 10A and 10B on both sides are driven by the single driving circuit element 3. Since the double-sided display can also be driven by the single driving circuit element 3 with this structure, the reduction in the size of the entire unit can be achieved.

FIG. 6 shows an example of a COF (Chip On Film) in which the driving circuit element (semiconductor chip) 3 is mounted on the wiring substrate 2. As in the above-described example, only the self-emitting element area 10A on one side can be driven by the driving circuit element 3. Alternatively, signal input paths as indicated with arrows can also be formed so that the self-emitting element areas 10A and 10B on both sides are driven by the single driving circuit element 3. Since the double-sided display can also be driven by the single driving circuit element 3 with this structure, the reduction in the size of the entire unit can be achieved.

Figure 7:
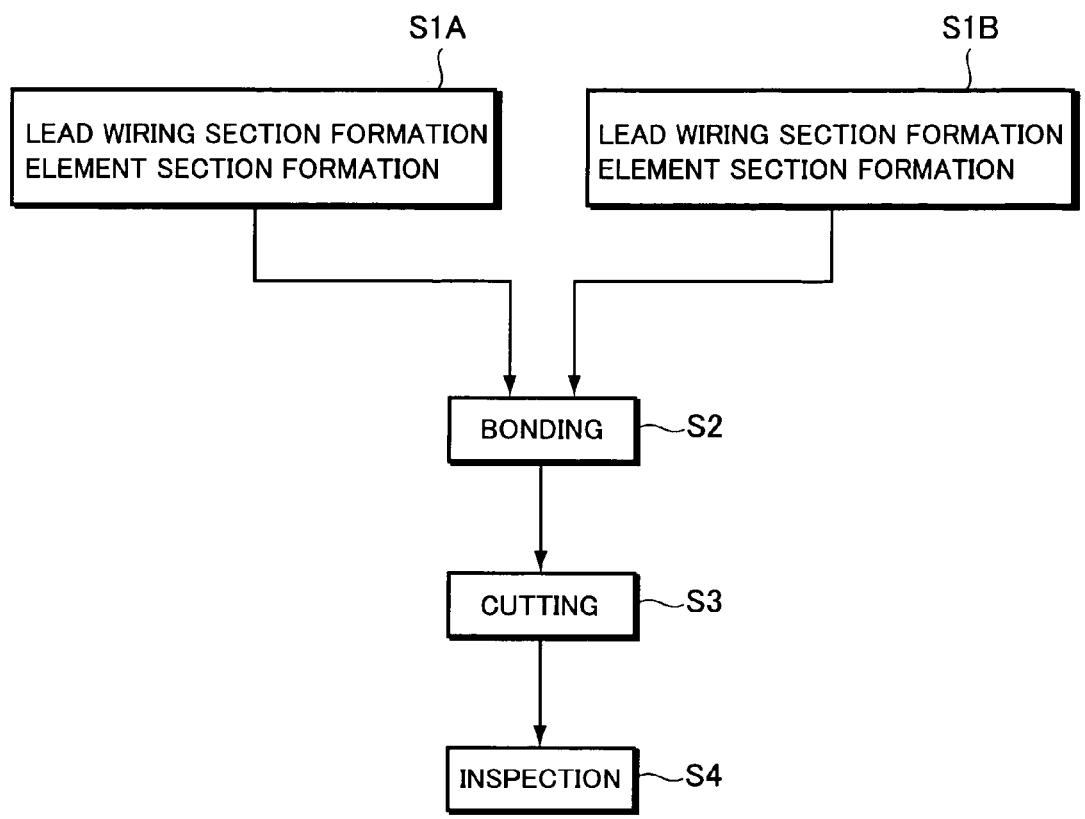
FIG. 7 is an explanatory view showing a method of fabricating the double-sided display device according to the embodiment of the present invention.

FIG. 7 is an explanatory view showing a method of fabricating the double-sided display device according to the above-described embodiment. In order to fabricate the above-described double-sided display device 1, the fabrication method includes the steps of: fabricating the self-emitting element areas 10A and 10B on the substrates 11A and 11B, respectively, and forming the lead wiring sections 20A and 20B of the self-emitting element areas 10A and 10B in parts of the ends of the substrates 11A and 11B, respectively (lead wiring formation and element section formation step: S1A and S1B); bonding the substrates 11A and 11B to each other so that the lead wiring sections 20A and 20B are positioned on the same side (bonding step: S2); and forming the cutout portions 21A and 21B in the parts of the sides of the substrates 11A and 11B where the lead wiring sections 20A and 20B are not formed (cutting step: S3) Thereafter, an inspection step S4 is conducted as needed.

Specifically, the lead wiring sections 20A and 20B and the self-emitting element areas 10A and 10B are formed for the respective substrates 11A and 11B (S1A and S1B). The pair of substrates 11A and 11B are bonded to each other so that their faces carrying the self-emitting element areas 10A and 10B face each other (S2). As a result, the display planes 1a and 1b are formed on the respective bottom face sides of the substrates 11A and 11B so as to be oriented in different directions. For bonding, the substrates 11A and 11B are bonded to each other so that the lead wiring sections 20A and 20B are positioned on the same side.

At the cutting step (S3) that follows, the cutout portions 21A and 21B are formed in the sides of the substrates 11A and 11B where the lead wiring sections 20A and 20B are not formed, for example, through a technique such as laser cutting (if a plurality of panels are formed on the large substrates 11A and 11B, the cutting for obtaining individual panels can be performed at this cutting step) Then, various necessary inspections are performed on an individual panel, thereby obtaining the double-sided display device 1 as a product.

Figure 8:
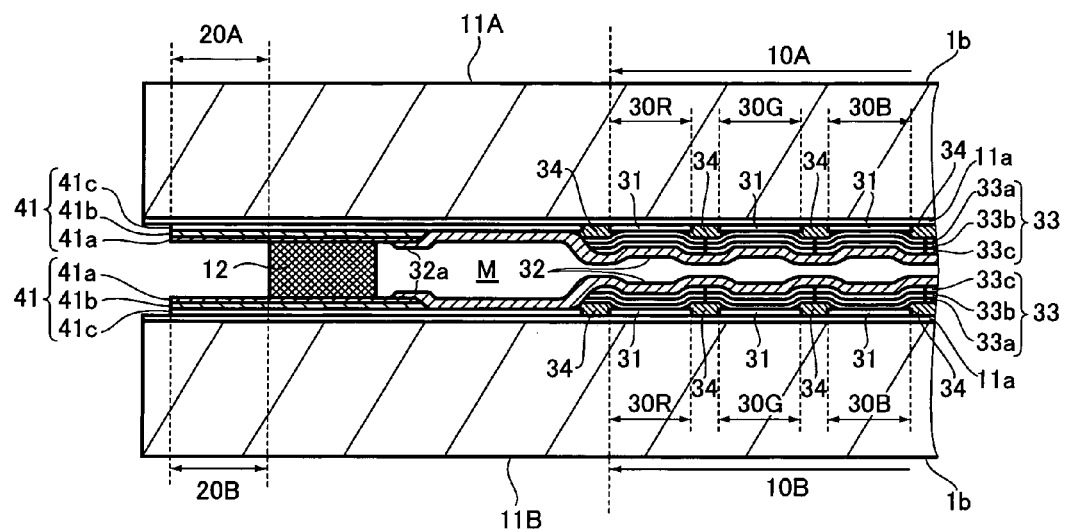
FIG. 8 is an explanatory view (sectional view) showing an example of the present invention, where a self-emitting element area is formed by organic EL elements.

FIG. 8 is an explanatory view (sectional view) showing an example of the present invention where organic EL elements are formed as the self-emitting element areas 10A and 10B (the same components as those in the above description are denoted by the same reference numerals, and the same description thereof is partially omitted).

In FIG. 8, the double-sided display device is obtained by bonding the substrates 11A and 11B through the bonding layer 12 to each other so that the self-emitting element areas 10A and 10B formed by organic EL elements are opposed to each other. The self-emitting element areas 10A and 10B are composed of a plurality of organic EL elements on the substrates 11A and 11B so as to interpose an organic material layer 33 including an organic light-emitting functional layer between a first electrode 31 and a second electrode 32. In the illustrated example, each of the organic EL elements has the following structure. A silicon coating layer 11a is formed on each of the substrates 11A and 11B. The first electrode 31 formed on the silicon coating layer 11a is used as an anode formed of a transparent electrode such as an ITO. Then, an insulating film 34 is formed on the first electrode 31 so that light-emitting areas 30R, 30G, and 30B are exposed through the insulating film 34. Then, in the light-emitting areas 30R, 30G, and 30B, a hole transport layer 33a, a light-emitting layer 33b, and an electron transport layer 33c are deposited on the first electrode 31. Then, the second electrode 32 made of a metal material such as Al is formed thereon so as to be used as a cathode. Specifically, the organic EL elements are formed in the sealed space M formed by bonding the substrates 11A and 11B to each other through the bonding layer 12. In this manner, the organic EL elements are formed to have a bottom-emission structure in which light is obtained through the substrates 11A and 11B.

In the sealed space M, an end 32a of the second electrode 32 is connected to a lead wiring 41. The lead wiring 41 is formed in a pattern while a second electrode layer 41c made of the same material and at the same fabrication step as those of the first electrode 31 is being insulated from the first electrode 31 by the insulating layer 34. On a led portion of the second electrode layer 41c, a first electrode layer 41b forming a low resistance wiring portion containing a silver-palladium (AgPd) alloy or the like is formed. On the first electrode layer 41b, a protective coating film 41a made of IZO or the like is formed as needed. The lead wirings 41 are put together in the ends of the substrates 11A and 11B, respectively, thereby forming the lead wiring sections 20A and 20B.

Although the self-emitting element areas 10A and 10B supposing a passive driving method are shown in this case, the driving system is not limited thereto. The self-emitting element areas 10A and 10B may be constituted to be driven by an active driving method.

It is preferred to use a flat plate-like or film-like substrate having transparency as each of the substrates 11A and 11B. The substrates 11A and 11B may be formed of glass, plastic or the like.

The combination of the hole transport layer 33a, the light-emitting layer 33b, and the electron transport layer 33c is generally used as the organic material layer 33, as described above. However, the hole transport layer 33a, the light-emitting layer 33b, and the electron transport layer 33c may be provided in plural in number instead of providing only one layer for each. Either one or both of the hole transport layer 33a and the electron transport layer 33b may be omitted. An organic material layer such as a hole injection layer, an electron injection layer, and a hole blocking layer may be added in accordance with an intended application. A conventionally used material (may be a polymeric material or a low-molecular material) can be appropriately selected for the hole transport layer 33a, the light-emitting layer 33b, and the electron transport layer 33c.

Examples of the light-emitting material for forming the light-emitting layer 33b include any materials that emit light (produces fluorescence) when returning from a singlet excited state to a ground state and that emit light (produces phosphorescence) when returning from a triplet excited state through a singlet excited state to a ground state.

A thermally curable adhesive, a chemically curable (two-part mixture) adhesive, a photo (ultraviolet)-curable adhesive or the like can be used as an adhesive for forming the bonding layer 12. Examples of such a material include acrylic resins, epoxy resins, polyesters, polyolefins, and the like. In particular, the use of an ultraviolet-curable epoxy resin adhesive having high quick curability, which does not need a heat treatment, is preferred.

In this example, the self-emitting element areas 10A and 10B, each being formed of organic EL elements, may display a single color or a plurality of colors. In order to achieve multi-color display, it is apparent that an RGB selective deposition method can be used. Besides, a method using the combination of a monochromatic light-emitting functional layer such as white or blue and a color filter or a color changing layer made of a fluorescent material (a CF method or a CCM method), a method of radiating an electromagnetic wave on a light-emitting area of a monochromatic light-emitting functional layer or the like so as to achieve the light emission of a plurality of colors (a photobleaching method), a method of vertically depositing at least two unit display areas to form a single unit display area (a SOLED (transparent Stacked OLED) method) and the like can be used.

According to the embodiment or examples as described above, the double-sided display device includes: the pair of substrates 11A and 11B, on which the self-emitting element areas 10A and 10B are respectively formed, being bonded to each other so that their faces carrying the self-emitting element areas 10A and 10B face each other; and the display planes 1a and 1b formed on the bottom face sides of the respective substrates 11A and 11B so as to be oriented in opposite directions. In this display device, the lead wiring sections 20A and 20B formed in the respective ends of the substrates 11A and 11B can be easily connected to a driving circuit component, a wiring substrate, or the like. Moreover, the space where the panel of the double-sided display device 1 is placed or where the entire module including a driving circuit component, a wiring substrate, and the like is placed can be reduced. As a result, the double-sided display device having high effectiveness for mounting it on small electronic equipment can be obtained.

While there has been described what are at present considered to be preferred embodiments of the present invention, it will be understood that various modifications may be made thereto, and it is intended that the appended claims cover all such modifications as fall within the true spirit and scope of the invention.

What is claimed is:

1. A double-sided display device comprises:
    a pair of substrates each including a self-emitting element area formed thereon, the substrate being bonded to each other so that their faces carrying the self-emitting element areas face each other; and
    displays each being formed on the side of a bottom face of each of the substrates, the displays being formed so as to be oriented in opposite directions, wherein:

a lead wiring section of the self-emitting element area formed on one of the substrates and a lead wiring section of the self-emitting element area formed on the other substrate are formed on the respective ends of the substrates on the same side;

each of the lead wiring sections is formed on a part of the end of each of the substrates; and a cutout portion is formed in a part of the end of each of the substrates where the lead wiring section is not formed.

2. The double-sided display device according to claim 1, wherein
the lead wiring sections are formed so as not to overlap each other.

3. The double-sided display device according to claim 1, wherein
the lead wiring sections are formed so that widths occupied by the lead wiring sections on the one side of the substrates differ from each other.

4. The double-sided display device according to claim 1, wherein
connecting ends branching from a single wiring substrate are connected to the lead wiring sections, respectively.

5. The double-sided display device according to claim 4, wherein
a driving circuit element is mounted on any one of the wiring substrate and at least one of the lead wiring sections.

6. A method of fabricating a double-sided display device including: a pair of substrates each including a self-emitting element area formed thereon, the substrates being bonded to each other so that their faces carrying the self-emitting element areas face each other; and displays each being formed on the side of a bottom face of each of the substrates, the displays being formed so as to be oriented in opposite directions, the method comprising the steps of:

forming the self-emitting element areas on the substrates, respectively, and forming lead wiring sections of the self-emitting element areas on parts of ends of the respective substrates, respectively;

bonding the substrates to each other so that the lead wiring sections are positioned on the same side; and forming a cutout portion in a part of the end of each of the substrates where the lead wiring section is not formed.

* * * * *